(12) United States Patent
Zou et al.

(10) Patent No.: US 10,866,611 B2
(45) Date of Patent: Dec. 15, 2020

(54) PHASE DIFFERENCE GENERATOR ERROR COMPENSATION METHOD OF DIGITAL FREQUENCY GENERATOR

(71) Applicant: Amlogic (Shanghai) Co., Ltd., Shanghai (CN)

(72) Inventors: Weihua Zou, Shanghai (CN); Ming Shi, Shanghai (CN); Yan Wang, Shanghai (CN)

(73) Assignee: Amlogic (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/728,238

(22) Filed: Dec. 27, 2019

(65) Prior Publication Data

US 2020/0209910 A1 Jul. 2, 2020

(30) Foreign Application Priority Data

Dec. 29, 2018 (CN) .......................... 2018 1 1647473

(51) Int. Cl.
*G06F 1/06* (2006.01)
*H03K 5/26* (2006.01)

(52) U.S. Cl.
CPC ........ *G06F 1/06* (2013.01); *H03K 5/26* (2013.01)

(58) Field of Classification Search
CPC ............ H03C 3/0975; H03K 5/26; G06F 1/06
See application file for complete search history.

(56) References Cited

U.S. PATENT DOCUMENTS

| 2010/0097126 A1* | 4/2010 | Yamazaki | H03L 7/0895 |
| | | | 327/536 |
| 2013/0073240 A1* | 3/2013 | Kameyama | G01K 15/00 |
| | | | 702/65 |
| 2013/0316661 A1* | 11/2013 | Lee | H03C 3/0975 |
| | | | 455/75 |

FOREIGN PATENT DOCUMENTS

| CN | 103716048 B | 4/2017 |
| CN | 108226916 A | 6/2018 |

* cited by examiner

*Primary Examiner* — Patrick C Chen
(74) *Attorney, Agent, or Firm* — Sunstein LLP

(57) ABSTRACT

The invention provides a phase difference generator error compensation method of a digital frequency generator, wherein the digital frequency generator comprises a phase difference generator, the phase difference generator comprises a phase compensation module and an adjusting module, the phase compensation module provides at least two clock signals, the at least two clock signals comprise a first clock signal and a second clock signal, and a phase difference exists between the first clock signal and the second clock signal; the phase compensation module outputs a third clock signal according to the first clock signal and the second clock signal, and the third clock signal is a difference signal of the first clock signal and the second clock signal; the adjusting module compensates the error of the third clock signal according to the clock phase difference. The method has the benefits that process errors in the phase difference generator are compensated.

7 Claims, 2 Drawing Sheets

PHASE DIFFERENCE GENERATOR ERROR COMPENSATION METHOD OF DIGITAL FREQUENCY GENERATOR

CROSS-REFERENCE TO RELATED APPLICATIONS

The present application claims priority to and the benefit of Chinese Patent Application No. CN 201811647473.5 filed on Dec. 29, 2018, the entire content of which is incorporated herein by reference.

BACKGROUND OF THE INVENTION

1. Field of the Invention

The invention relates to the technical field of electronics, and more particularly, to a phase difference generator error compensation method of a digital frequency generator.

2. Description of the Related Art

The digital frequency generator has a smaller area and a lower power consumption when compared with the traditional Phase Locked Loop (PLL). Therefore, the digital frequency generator can be flexibly applied to devices having lower frequencies and less strict requirements on a high performance, such as various serial command interfaces, cameras.

In the prior art, the digital frequency generator outputs a high-frequency signal CLKout by inputting a high-frequency signal CLKin, and a formula CLKou=CLKin/(INT+M/N)=CLKin/(INT+Frac) is satisfied, wherein INT represents input data is integer, and Frac represents input data is decimal.

The digital frequency generator comprises a divider, SDM (Sigma-Delta Modulation), and a phase difference generator.

A high-frequency clock signal CLKin and a division control bit X are input into the divider, then a high-frequency clock signal CLKB is output from the divider, and CLKB=CLKin/X is satisfied.

Data is input into SDM (sigma-delta Modulation); INT+Frac, a division control bit X is output to the divider, and a phase error value to be compensated for each cycle is output to the phase difference generator.

CLKB and a phase error value to be compensated for each cycle are input into the phase difference generator, the a high-frequency clock signal CLKou subjected to the phase compensation is output, and CLKou=CLKin/(INT+Frac) is satisfied.

However, in the prior art, process errors exist in the process of manufacturing of the phase difference generator. The process errors may vary from one chip to another chip. In addition, the above-mentioned process errors may affect the effect of the phase difference generator on the phase error compensation, so that the precision of the phase difference generator is decreased, and the quality of an output clock is reduced. The effect of the process errors is not negligible for large-scale mass production, in particular in the case of a process for a small size product.

SUMMARY OF THE INVENTION

Given that the foregoing problems exist in the prior art, the present invention provides a phase difference generator error compensation method of a digital frequency generator, so that process errors in the phase difference generator are correspondingly compensated, then the compensation precision of the phase difference generator is improved, and the product quality is improved.

The technical solution is as follows:

a phase difference generator error compensation method of a digital frequency generator, applied to the digital frequency generator, the digital frequency generator comprising the phase difference generator, the phase difference generator comprising a phase compensation module and an adjusting module, wherein the phase compensation module provides at least two clock signals, the at least two clock signals comprise a first clock signal and a second clock signal, and a phase difference exists between the first clock signal and the second clock signal; the phase compensation module outputs a third clock signal according to the first clock signal and the second clock signal, and the third clock signal is a difference signal of the first clock signal and the second clock signal; and the adjusting module compensates an error of the third clock signal according to the clock phase difference.

Preferably, in the phase difference generator error compensation method of a digital frequency generator, wherein the clock phase difference is expressed by $T_{VCO}*2\pi/2^N$;

wherein $T_{VCO}$ represents a time when clock signals are input to a fraction divider for generating the first clock signal and the second clock signal;

$2^N$ represents the number of the clock signals configured to generate the third clock signal.

Preferably, in the phase difference generator error compensation method of a digital frequency generator, wherein the phase difference generator comprises a phase difference circuit, the phase difference circuit provides a comparator, a forward input end of the comparator is connected to a reference voltage, a reverse input end of the comparator is connected in parallel with a voltage source VDD;

the phase difference generator further comprises a first current source and a second current source;

the phase difference generator further comprises a capacitor connecting the reverse input end of the comparator to GND;

a first switch controlled by the first clock signal is connected in series between the first current source and the reverse input end of the comparator; and a second switch controlled by the second clock signal is connected in series between the second current source and the reverse input end of the comparator.

Preferably, in the phase difference generator error compensation method of a digital frequency generator, wherein the adjusting module adjusts a current of the first current source, and/or a current of the second current source.

Preferably, in the phase difference generator error compensation method of a digital frequency generator, wherein the adjusting module adjusts a capacitance value of the capacitor, and/or a charging/discharging speed.

Preferably, in the phase difference generator error compensation method of a digital frequency generator, wherein the adjusting module adjusts an amplitude value of the reference value.

Preferably, in the phase difference generator error compensation method of a digital frequency generator, wherein the adjusting module compensates the error of the third clock signal according to the clock phase difference by the following formula:

$$(VDD - V_{ref}) = A * T_{VCO} * 2\pi/2^N * \frac{I}{C}$$

wherein VDD represents the voltage source VDD;

$V_{ref}$ represents the reference voltage;

T represents the time corresponding to the phase difference;

I represents an overall current, and the overall current is a sum of the current of the first current source and the current of the second current source;

C represents the capacitance value of the capacitor; and

A represents a ratio of the current of the first current source to the overall current.

Preferably, in the phase difference generator error compensation method of a digital frequency generator, wherein a relationship between the current of the first current source and the current of the second current source satisfies the following formula:

$A*I+B*I=I;$ wherein B represents a ratio of the current of the second current source to the overall current.

Preferably, in the phase difference generator error compensation method of a digital frequency generator, wherein a value of the current of the first current source is in a range from 0 to I, and a value of the current of the second current source is in a range from 0 to I.

By adopting the above-mentioned technical solutions, the present invention has the beneficial effects that process errors in the phase difference generator are correspondingly compensated, so that the compensation precision of the phase difference generator is improved, and the product quality is improved.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
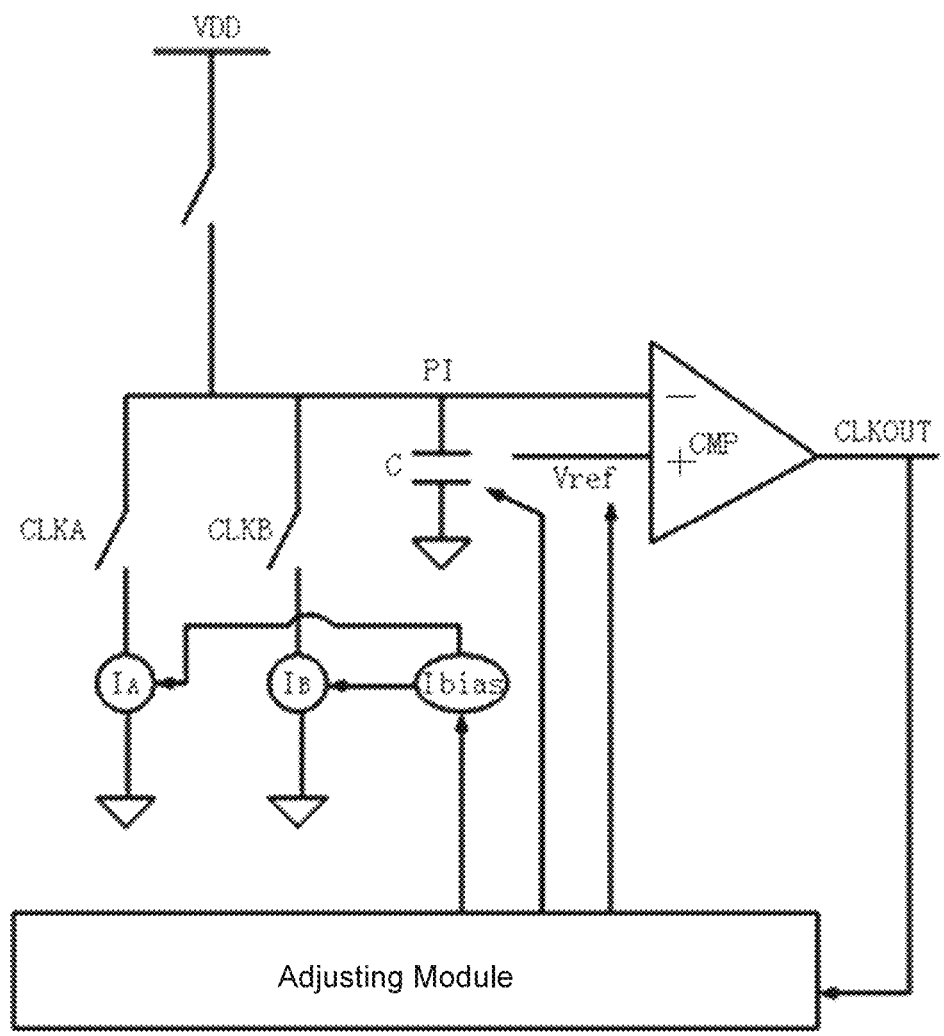
FIG. 1 is a circuit diagram of a phase difference circuit according to the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The invention comprises phase difference generator error compensation method of a digital frequency generator, applied to the digital frequency generator, the digital frequency generator comprising the phase difference generator, the phase difference generator comprising a phase compensation module and an adjusting module, wherein the phase compensation module provides at least two clock signals, the at least two clock signals comprise a first clock signal CLKA and a second clock signal CLKB, and a phase difference exists between the first clock signal CLKA and the second clock signal CLKB; the phase compensation module outputs a third clock signal CLKOUT according to the first clock signal CLKA and the second clock signal CLKB, and the third clock signal CLKOUT is a difference signal of the first clock signal CLKA and the second clock signal CLKB; and the adjusting module compensates an error of the third clock signal CLKOUT according to the clock phase difference.

In the above-mentioned embodiment, a plurality of clock signals are provided by the phase compensation module, a difference signal of the first clock signal and the second clock signal is obtained, then an error of the difference signal is compensated by the adjusting module according to the clock phase difference. In this way, process errors in the phase difference generator are correspondingly compensated, so that the compensation precision of the phase difference generator is improved, and the product quality is improved.

Furthermore, as a preferred embodiment, the number of the third clock signal CLKOUT generated from the phase difference generator is $2^N+1$, and two clock signals, the first clock signal CLKA and the second clock signal CLKB, are selected at a particular time point; a clock phase difference exists between the first clock signal CLKA and the second clock signal CLKB, then a compensation error of the phase difference generator is obtained by the adjusting module of the phase difference generator according to the clock phase difference.

The above-mentioned embodiment may work in a TSMC 28 nm 12 nm chip, and process errors in the phase difference generator are precisely compensated, and the product quality is improved.

Furthermore, in the above-mentioned embodiment, the clock phase difference is expressed by $T_{VCO}*2\pi/2^N$;

wherein $T_{VCO}$ represents a time when clock signals are input to a fraction divider for generating the first clock signal CLKA and the second clock signal CLKB;

$2^N$ represents the number of the clock signals configured to generate the third clock signal CLKOUT.

Furthermore, in the above-mentioned embodiment, as shown in FIG. 1, the phase difference generator comprises a phase difference circuit, the phase difference circuit provides a comparator CMP, a forward input end of the comparator CMP is connected to a reference voltage Vref, a reverse input end of the comparator CMP is connected in parallel with a voltage source VDD;

the phase difference generator further comprises a first current source $I_A$ and a second current source $I_B$;

the phase difference generator further comprises a capacitor C connecting the reverse input end of the comparator CMP to GND;

a first switch controlled by the first clock signal CLKA is connected in series between the first current source $I_A$ and the reverse input end of the comparator CMP; and a second switch controlled by the second clock signal CLKB is connected in series between the second current source $I_B$ and the reverse input end of the comparator CMP.

Figure 2:
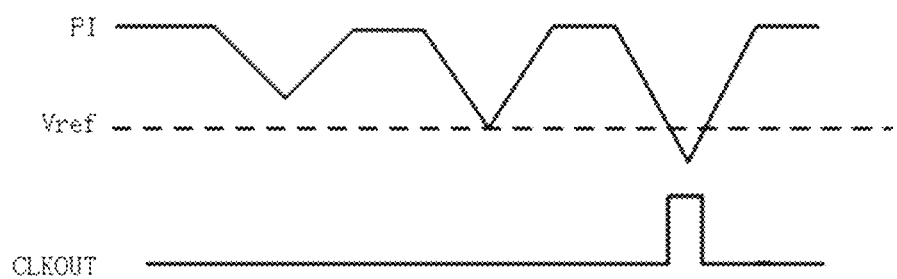
FIG. 2 is a schematic diagram showing the relationship between a difference voltage, a reference voltage and a third clock signal according to the present invention.

Furthermore, as a preferred embodiment, a relationship between a difference voltage PI and the reference voltage Vref is compared in the comparator CMP, wherein the difference voltage PI refers to a voltage obtained by performing charging and discharging operation on the capacitor C through the first current source and the second current source; as shown in FIG. 2, when the difference voltage PI is less than the reference voltage Vref, the frequency of the third clock signal CLKOUT increases, and the comparator CMP outputs the third clock signal CLKOUT.

Furthermore, as a preferred embodiment, when the phase difference generator selects three clock signals at a particular time point, that is, a third current source is added to the phase difference circuit, and a third switch controlled by the third clock signal is connected in series between the third current source and the reverse input end of the comparator CMP. Therefore, the adjusting module is connected to a reference current source I bias. The adjusting module may adjust the current of the first current source $I_A$, and/or the current of the second current source $I_B$, and/or the current of the third current source through the reference current source I bias, so that process errors in the phase difference generator are correspondingly compensated.

Furthermore, in the above-mentioned embodiment, the adjusting module is connected to a reference current source I bias. The adjusting module may adjust the current of the first current source $I_A$, and/or the current of the second current source $I_B$ through the reference current source I bias, so that process errors in the phase difference generator are correspondingly compensated.

Furthermore, in the above-mentioned embodiment, the adjusting module adjusts a capacitance value of the capacitor C, and/or a charging/discharging speed, so that process errors in the phase difference generator are correspondingly compensated.

Furthermore, in the above-mentioned embodiment, the adjusting module adjusts an amplitude value of the reference voltage Vref, so that process errors in the phase difference generator are correspondingly compensated.

Furthermore, in the above-mentioned embodiment, a relationship between the current of the first current source $I_A$ and the current of the second current source $I_B$ satisfies the following formula:

$$p\ A*I+B*I=I.$$

Furthermore, in the above-mentioned embodiment, a value of the current of the first current source $I_A$ is in a range from 0 to I, and a value of the current of the second current source $I_B$ is in a range from 0 to I.

Furthermore, in the above-mentioned embodiment, the following formula may be obtained from the phase difference circuit:

$$I*A*(T+T_{VCO}*2\pi/2^N)+I*B*T=(VDD-Vref)*C; \quad (1)$$

wherein VDD represents the voltage source VDD;
Vref represents the reference voltage Vref;
T represents the time corresponding to the phase difference;
I represents an overall current, and the overall current is a sum of the current of the first current source $I_A$ and the current of the second current source $I_B$;
C represents the capacitance value of the capacitor C; and
A represents a ratio of the current of the first current source $I_A$ to the overall current; and
B represents a ratio of the current of the second current source $I_B$ to the overall current.

The following formula is obtained from the formula (1):

$$T = \frac{(VDD-Vref)*C}{I} - A*T_{VCO}*2\pi/2^N; \quad (2)$$

T1 and T2 (two time points corresponding to two phase differences) are substituted into the formula (2), then the following formula is obtained:

$$T2-T1=(A1-A2)*T_{VCO}*2\pi/2^N; \quad (3)$$

wherein T2−T1 represents a compensation phase difference between two compensation cycles of the phase compensation module;
A1 represents a ratio of the current of the first current source $I_A$ to the overall current at the period of time T1; and
A2 represents a ratio of the current of the first current source $I_A$ to the overall current at the period of time T2.

From the formula (3), process errors in the phase difference generator are correspondingly compensated by adjusting the current of the first current source $I_A$.

From the formula (2), when A=1, B=0, the following formula may be obtained by conversion:

$$(VDD-Vref) = (A*T_{VCO}*2\pi/2^N + T)*\frac{I}{C}; \quad (4)$$

and a target optimum value may be obtained from the formula (4).

The adjusting module compensates the error of the third clock signal CLKOUT by formula (4) according to the clock phase difference.

Furthermore, as a preferred embodiment, when T=0 for formula (4), the following formula is obtained:

$$(VDD - Vref) = A * T_{VCO} * 2\pi/2^N * \frac{I}{C}; \quad (5)$$

In formula 5, the overall current I, the capacitance value C of the capacitor C, and the reference voltage Vref may all deviate from set values. Since the process errors of each manufactured product are different, that is, the overall current I, the capacitance value C of the capacitor C, and the reference voltage Vref are different, when the adjusting module sets as A=1, B=0, the overall current, the capacitance value of the capacitor C, and the reference voltage Vref are adjusted according to the third clock signal CLKOUT, and the overall current, the capacitance value C of the capacitor C, and the reference voltage Vref are made to be closer to the set values, so that process errors in the phase difference generator are correspondingly compensated, the compensation precision of the phase difference generator is improved, and the clock quality is improved.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A phase difference generator error compensation method of a digital frequency generator, applied to the digital frequency generator, the digital frequency generator comprising the phase difference generator, the phase difference generator comprising a phase compensation module and an adjusting module, wherein
    the phase compensation module provides at least two clock signals, the at least two clock signals comprise a first clock signal and a second clock signal, and a phase difference exists between the first clock signal and the second clock signal; the phase compensation module outputs a third clock signal according to the first clock signal and the second clock signal, and the third clock signal is a difference signal of the first clock signal and the second clock signal; and
    the adjusting module compensates an error of the third clock signal according to the clock phase difference;
    the phase difference generator comprises a phase difference circuit, the phase difference circuit provides a comparator, a non-inverting input end of the comparator is connected to a reference voltage, an inverting input end of the comparator is connected in parallel with a voltage source VDD;
    the phase difference generator further comprises a first current source and a second current source;
    the phase difference generator further comprises a capacitor connecting the inverting input end of the comparator to GND;
    a first switch controlled by the first clock signal is connected in series between the first current source and the inverting input end of the comparator; and
    a second switch controlled by the second clock signal is connected in series between the second current source and the inverting input end of the comparator;
    wherein the adjusting module compensates the error of the third clock signal according to the clock phase difference by the following formula:

$$(VDD - Vref) = A * T_{VCO} * 2\pi/2^N * \frac{I}{C}$$

wherein VDD represents the voltage source VDD;
$V_{ref}$ represents the reference voltage;
T represents the time corresponding to the phase difference;
I represents an overall current, and the overall current is a sum of the current of the first current source and the current of the second current source;
C represents the capacitance value of the capacitor; and
A represents a ratio of the current of the first current source to the overall current.

2. The phase difference generator error compensation method of a digital frequency generator of claim 1, wherein the clock phase difference is expressed by $T_{VCO}*2\pi/2^N$;
    wherein $T_{VCO}$ represents a time when clock signals are input to a fraction divider for generating the first clock signal and the second clock signal;
    $2^N$ represents the number of the clock signals configured to generate the third clock signal.

3. The phase difference generator error compensation method of a digital frequency generator of claim 1, wherein the adjusting module adjusts a current of the first current source, and/or a current of the second current source.

4. The phase difference generator error compensation method of a digital frequency generator of claim 1, wherein the adjusting module adjusts a capacitance value of the capacitor, and/or a charging/discharging speed.

5. The phase difference generator error compensation method of a digital frequency generator of claim 1, wherein the adjusting module adjusts an amplitude value of the reference voltage.

6. The phase difference generator error compensation method of a digital frequency generator of claim 1, wherein a relationship between the current of the first current source and the current of the second current source satisfies the following formula:

$$A*I+B*I=I;$$

wherein B represents a ratio of the current of the second current source to the overall current.

7. The phase difference generator error compensation method of a digital frequency generator of claim 1, wherein a value of the current of the first current source is in a range from 0 to I, and a value of the current of the second current source is in a range from 0 to I.

* * * * *